United States Patent
Pulipati et al.

(10) Patent No.: US 12,543,376 B2
(45) Date of Patent: Feb. 3, 2026

(54) HIGH-VOLTAGE BASED LOW-POWER, TEMPERATURE DEPENDENT, THIN-OXIDE ONLY ON-CHIP HIGH CURRENT LOW DROP OUT (LDO) REGULATOR

(71) Applicant: XILINX, INC., San Jose, CA (US)

(72) Inventors: Narendra Kumar Pulipati, Hyderabad (IN); Sree Rama Krishna Chaithnya Saraswatula, Hyderabad (IN); Santosh Yachareni, Hyderabad (IN); Anil Kumar Kandala, Hyderabad (IN); Shidong Zhou, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 484 days.

(21) Appl. No.: 18/091,607

(22) Filed: Dec. 30, 2022

(65) Prior Publication Data

US 2024/0222354 A1    Jul. 4, 2024

(51) Int. Cl.
| | |
|---|---|
| G05F 1/567 | (2006.01) |
| G05F 1/575 | (2006.01) |
| H10D 30/68 | (2025.01) |
| H10D 84/01 | (2025.01) |
| H10D 84/83 | (2025.01) |
| H10D 86/85 | (2025.01) |

(52) U.S. Cl.
CPC ............ *H10D 86/85* (2025.01); *G05F 1/567* (2013.01); *G05F 1/575* (2013.01); *H10D 30/681* (2025.01); *H10D 84/01* (2025.01); *H10D 84/83* (2025.01)

(58) Field of Classification Search
CPC ...... H10D 86/85; H10D 30/681; H10D 84/01; H10D 84/83; G05F 1/567; G05F 1/575
See application file for complete search history.

(56) References Cited

U.S. PATENT DOCUMENTS

| | | | | |
|---|---|---|---|---|
| 9,791,874 | B1 * | 10/2017 | Wang | G05F 1/575 |
| 10,073,478 | B1 * | 9/2018 | Ivanov | G05F 1/595 |
| 2021/0303013 | A1 * | 9/2021 | Sun | G05F 1/575 |
| 2024/0120837 | A1 * | 4/2024 | Routledge | H02M 3/07 |

\* cited by examiner

*Primary Examiner* — David Vu
*Assistant Examiner* — Brandon C Fox
(74) *Attorney, Agent, or Firm* — Patterson + Sheridan, LLP

(57) ABSTRACT

Techniques to utilize thin-oxide devices, such as gate-all-around metal-oxide-semiconductor field-effect transistors (MOSFETs), in high voltage environments, such as to provide a high-voltage based low-power, temperature dependent, thin-oxide-only on-chip high current low drop out (LDO) regulator in a system-on-chip (SoC), such as provide power to configuration random-access memory (CRAM) cells distributed throughout configurable/programmable circuitry. Thin-oxide only circuitry may include thin-oxide-only amplifier circuitry, thin-oxide-only power gate circuitry, thin-oxide-only level shifters that shift voltage swings of control signals to voltage domains of the power gate circuitry, and thin-oxide-only clamp circuitry.

20 Claims, 10 Drawing Sheets

HIGH-VOLTAGE BASED LOW-POWER, TEMPERATURE DEPENDENT, THIN-OXIDE ONLY ON-CHIP HIGH CURRENT LOW DROP OUT (LDO) REGULATOR

TECHNICAL FIELD

Examples of the present disclosure generally relate to a high-voltage based low-power, temperature dependent, thin-oxide only on-chip high current low drop out (LDO) regulator.

BACKGROUND

In complementary metal-oxide-semiconductor (CMOS) technologies, gate oxide is a dielectric layer that separates the gate terminal of a metal-oxide-semiconductor field-effect transistor (MOSFET) from the source and drain, and from a conductive channel that connects the source and drain when the MOSFET is turned on. Gate oxide is formed by thermal oxidation of the silicon of the channel to form an insulating layer of silicon dioxide. A conductive gate material is deposited over the gate oxide to form the MOSFET.

As channel lengths scale down, supply voltage and gate oxide thickness also scale down. At shorter channel lengths, short channel effects (e.g., drain-induced barrier lowering, velocity saturation, quantum confinement, and hot carrier degradation) may arise. To keep the short channel effect under control, gate oxide thickness is reduced nearly in proportion to channel length. Reducing gate oxide thickness may render a circuit vulnerable to quantum-mechanical tunneling, which gives rise to gate leakage current.

Overstressing the gate oxide layer of a MOSFET (e.g., with a high gate-to-source voltage for a prolonged period) may lead to stress induced leakage current, which may reduce the lifetime of the MOSFET. Smaller structures are more vulnerable because of their lower capacitance. All thin layer dielectrics are vulnerable, whereas chips made by processes employing thicker oxide layers are less vulnerable.

For CMOS technologies that produce structures on a scale of 0.18 micrometers (um) and below, gate oxide thickness may be approximately 3 nm (i.e. 0.18 um×⅕₀ ≈ 3 nanometers (nm)) or less. Thus, as used herein, the term thin oxide or thin-ox refers to a gate oxide thickness equal to or less than approximately 3 nm. The term thick oxide or thick-ox refers to a gate oxide thickness greater than 3 nm.

Semiconductor manufacturing processes are often referred to in terms of nanometers. The industry is currently moving towards a 2 nm process, which follows 3 nm, 5 nm, and 7 nm processes (the terms 2 nm, 3 nm, 5 nm, and 7 nm are relative terms and do not necessarily directly relate to physical dimensions of transistors). Operating voltages and voltage swings become smaller with each subsequent fabrication process. In general, 2 nm fabrication processes are thin-ox processes, 5 nm and 7 nm fabrication processes are thick-ox processes, and 3 nm fabrication processes may include thin-ox and/or thick-ox processes.

Applying voltages and voltage swings of thick-ox circuitry to thin-ox circuitry may overstress the gate oxide layers of the thin-ox circuitry (i.e., gate-to-source voltages).

SUMMARY

High-voltage based low-power, temperature dependent, thin-oxide only on-chip high current low drop out (LDO) regulators are described. One example is an apparatus that includes low drop out (LDO) regulator circuitry that regulates an output voltage based on a reference voltage, where the LDO regulator circuitry includes metal-oxide-semiconductor field-effect transistors (MOSFETs), gate-oxide layers of the MOSFETs are 3 nanometers or less, a voltage of a supply rail of the LDO regulator circuitry, the reference voltage, and the output voltage exceed a desired gate-to-source voltage of the MOSFETs, and the LDO regulator circuitry maintains gate-to-source voltages of the MOSFETs within the desired gate-to-source voltage.

Another example is an integrated circuit (IC) device that includes a gate-all-around metal-oxide-semiconductor field-effect transistor (MOSFET), configured to couple a first node of the IC device to a second node of the IC device, and power gate circuitry that controls the MOSFET based on a power gate control, where a voltage swing of the power gate control exceeds a desired gate-to-source voltage of the MOSFET, and the power gate circuitry shifts the voltage swing of the power gate control to maintain the gate-to-source voltage of the MOSFET within the desired gate-to-source voltage.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
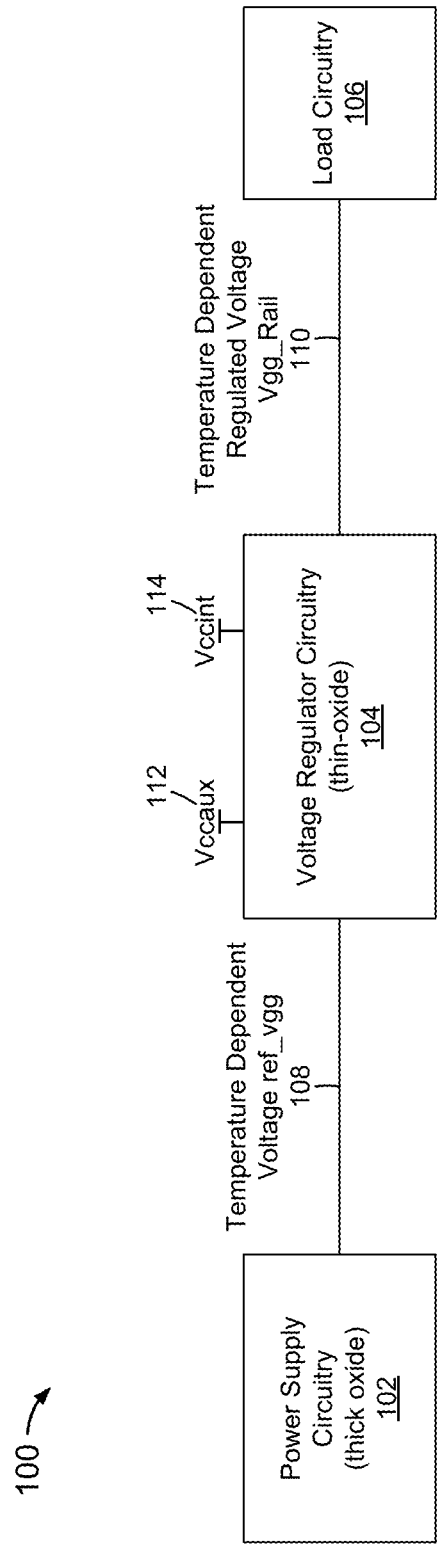
FIG. 1 is a block diagram of a system that includes power supply circuitry fabricated with a thick oxide fabrication process, voltage regulator circuitry fabricated with a thin oxide fabrication process, and load circuitry, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe high-voltage based low-power, temperature dependent, thin-oxide only on-chip high current low drop out (LDO) regulators.

Thick-oxide device support is expected to cease from 2 nm fabrication processes and beyond. A high voltage based low power on-chip regulated power supply which is temperature dependent with thin-ox devices only, is disclosed herein for gate-all-around (i.e., 2 nm and beyond) fabrication processes. Also disclosed herein are techniques to reduce active leaker current and power-gating features, which may improve yield. Fixed and programmable leaker circuits on a power-gated supply may enhance the stability.

Embodiments herein enable the design of thin-ox only low power voltage regulator without incurring over voltage violations. Reliability/robustness is assured by using enable/disable controls generated by thin-ox based level shifters in normal and power-gated modes of operation. Embodiments herein may be applied in designing thin-ox only based, low-power/high yield analog designs on 2 nm fabrication processes and beyond.

Embodiments herein may be useful to integrate thin-ox circuitry with legacy thick-ox circuitry (e.g., where a thick-ox based power supply is applied to thin-ox devices). For example, a legacy system may include a thick-ox power supply that provides power to thick-ox circuitry, and the thick-ox circuitry is to be converted to thin-ox circuitry that will receive power from the legacy thick-ox power supply.

Embodiments herein describe an application in which a high-voltage based low-power, temperature dependent, thin-oxide only on-chip high current LDO regulator regulates a thick-ox power supply to drive configuration memory cells distributed throughout a system-on-chip (SoC). The same voltage may be used to generate the address voltage to configuration memory cells in write mode. Such an embodiment may be useful to maintain an optimum balance between memory write issues at cold and interconnect performance at higher temperatures, which may minimize reliability issues.

Embodiments herein may be useful to provide a distributed regulated power supply using thin-ox devices only (e.g., gate-all-around technologies) with low power-consumption, using a legacy high power supply voltage (VCC_AUX) targeting the same specifications as with thick-ox devices.

Embodiments herein may be useful for 2 nm & below sub-micron technology based analog designs.

Embodiments herein may be useful in applications that utilize multiple power domains (i.e., where power gating would be useful), applications that utilize a distributed regulator (i.e., where low power consumption and robust functionality would be useful), and/or thin-ox only analog designs that use higher supply voltages (i.e., not limited to regulator design). Example applications include, without limitation, field-programmable gate arrays (FPGAs) and application-specific integrated circuits (ASICs).

FIG. 1 is a block diagram of a system 100 that includes power supply circuitry 102 fabricated with a thick oxide fabrication process, voltage regulator circuitry 104 fabricated with a thin oxide fabrication process, and load circuitry 106, according to an embodiment.

Voltage regulator circuitry 106 may include low dropout (LDO) voltage regulator circuitry. A LDO regulator is a DC linear voltage regulator that can regulate an output voltage even when the supply voltage is very close to the output voltage. An advantage of an LDO regulator over other DC-to-DC voltage regulators include an absence of switching noise (as no switching takes place), smaller device size (as neither large inductors nor transformers are needed), and design simplicity (may consists of a reference, an amplifier, and a pass element).

In the example of FIG. 1, voltage regulator circuitry 104 receives a relatively high voltage (e.g., 1.5 v) temperature dependent voltage ref_vgg 108 from power supply circuitry 102, and a relatively high supply voltage Vccaux 112, and provides a corresponding high voltage (e.g., 1.5 v) temperature dependent regulated voltage Vgg_Rail 110 to load circuitry 106. Voltage regulator circuitry 106 includes thin-gate-oxide (thin-ox), metal-oxide-semiconductor field-effect transistors (MOSFETs). Absent features disclosed herein, the high voltages would impart undue stress to gate oxide layers of the MOSFETs.

Figure 2:
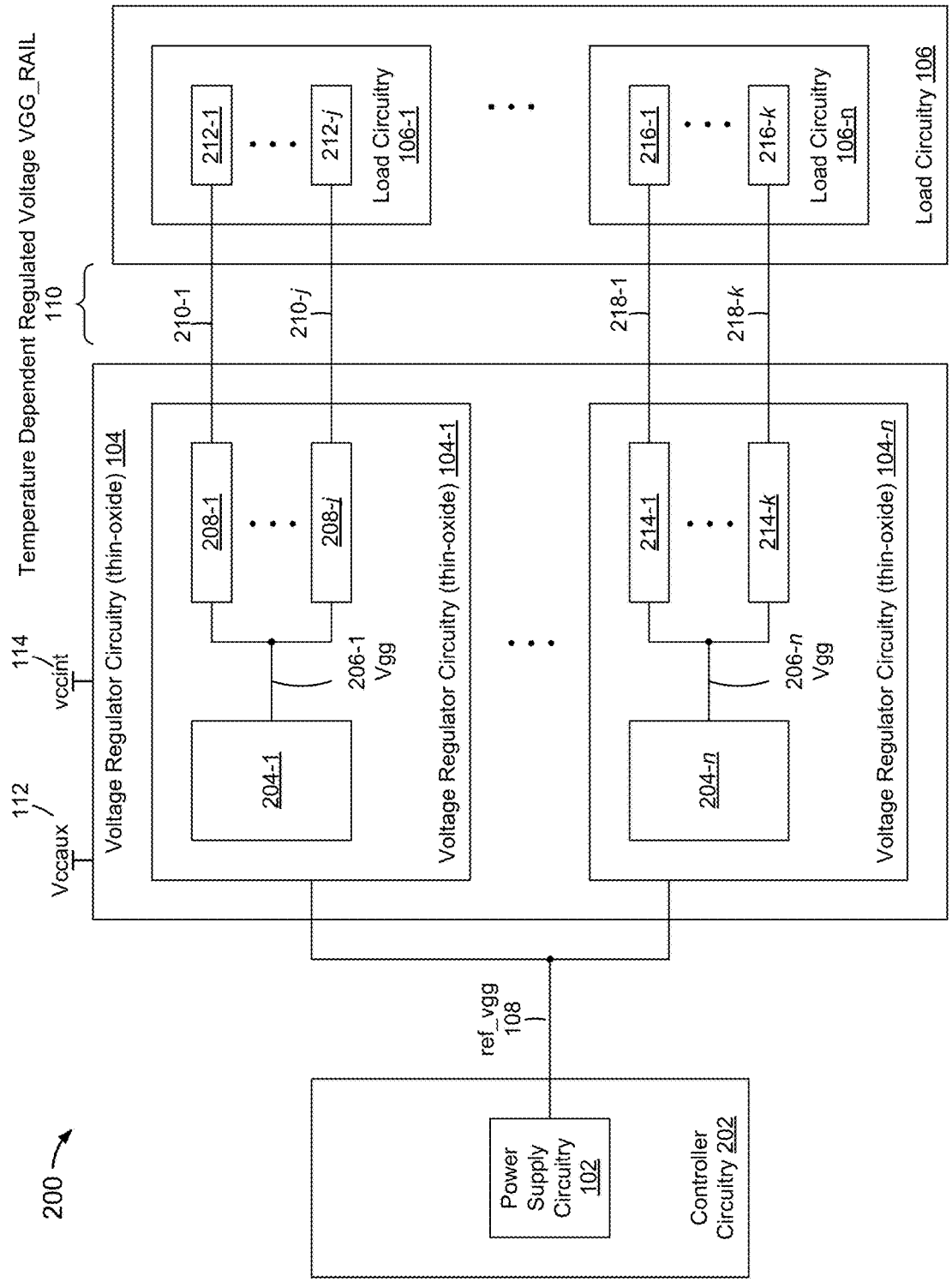
FIG. 2 is a block diagram of a system that includes the power supply circuitry, the voltage regulator circuitry, and the load circuitry of FIG. 1, according to an embodiment.

FIG. 2 is a block diagram of a system 200 that includes power supply circuitry 102, voltage regulator circuitry 104, and load circuitry 106, according to an embodiment. In the example of FIG. 2, voltage regulator circuitry 104 includes voltage regulator circuitry 104-1 through **104-*n*, and load circuitry 106 includes corresponding load circuitry 106-1 through 106-*n***, where n is a positive integer.

Voltage regulator circuitry 104-1 includes a core circuit 204-1 and sub-circuits 208-1 through **208-*j*, where j is a positive integer. Load circuitry 106-1 includes loads 212-1 through 212-*j*. Voltage regulator circuitry 104-1 provides an internal temperature dependent regulated voltage Vgg 206-1 to sub-circuits 208-1 through 208-*j*, based on ref_vgg 108. Sub-circuits 208-1 through 208-*j* provide temperature dependent regulated voltages Vgg_Rail 210-1 through 210-*j* to respective loads 212-1 through 212-*j*, based on Vgg 206-1**.

Voltage regulator circuitry 104-2 through **104-*n* may be similar to voltage regulator circuitry 104-1, and load circuitry 106-2 through 106-*n* may be similar to load circuitry 106-1**.

In the example of FIG. 2, voltage regulator circuitry **104-*n* includes a core circuit 204-*n* and sub-circuits 214-1 through 214-*k*, and load circuitry 106-*n* includes load circuits 216-1 through 216-*k***, where k is a positive integer. In an embodiment, j and k are equal to one another. In another embodiment, j and k differ from one another. In an embodiment, j and/or k may be approximately 150.

In an embodiment, system 200 represents an integrated circuit (IC) device (e.g., an IC die, chip, chipset, or systemon-a-chip (SoC)) that includes configurable circuitry (e.g., switches, multiplexers, and/or other programmable logic). In this example, load circuitry 106-1 through 106-n may represent random-access memory (RAM) for storing configuration parameters. In this example, load circuitry 106-1 through 106-n may be referred to as configuration RAM or CRAM, which may be distributed amongst the configurable circuitry. Load circuitry 106-1 through 106-n may represent respective rows of CRAM, and each of loads 212-1 through 212-j and 26-1 through 216-j may include multiple CRAM cells. Further in this example, core circuit 204-1 may be referred to as configuration frame (CFRAME) circuitry and sub-circuits 208-1 through 208-j may be referred to as RCLK circuitry.

System 200 further includes controller circuitry 202 (e.g., a platform management controller or management engine), which includes power supply circuitry 102.

In an embodiment, voltage regulator circuitry 104-1 and/or sub-circuits 208 include power gating circuitry to disable load circuitry 106-1 and/or to disable individual loads 212, such as described further below. The power gating circuitry may be useful to conserve power and/or reduce leakage.

Figure 3:
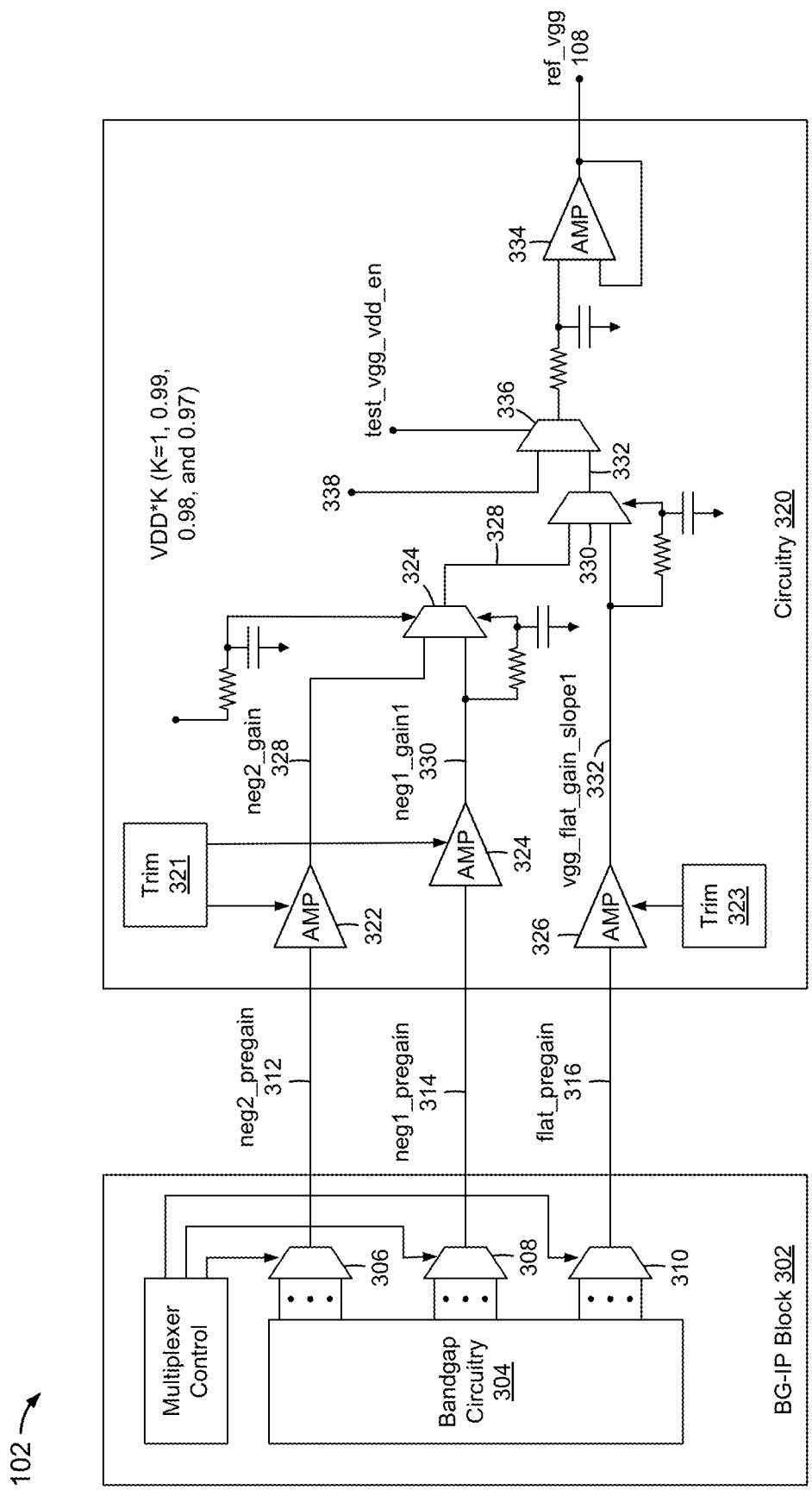
FIG. 3 is a schematic diagram of the power supply circuitry, according to an embodiment.
Figure 4:
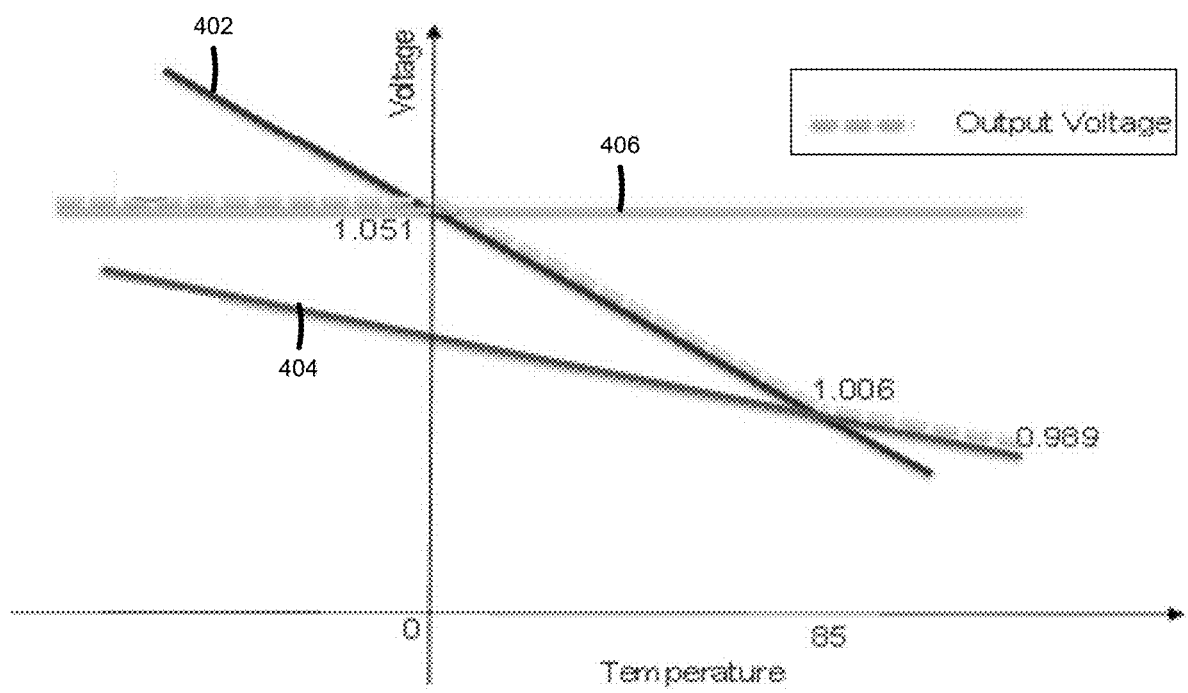
FIG. 4 illustrates example temperature-dependent voltage slopes or profiles for use by the power supply circuitry.

FIG. 3 is a schematic diagram of power supply circuitry 102, according to an embodiment. FIG. 3 is described below with reference to FIG. 4. FIG. 4 illustrates example temperature-dependent voltage slopes or profiles 402, 404, and 406.

In FIG. 3, power supply circuitry 102 includes a bandgap intellectual property (BG-IP) block 302. BG-IP block 302 includes bandgap circuitry 304 that provides a variety of selectable temperature-dependent voltage slopes or profiles, such as profiles 402, 404, and 406 of FIG. 4. BG-IP block 302 further includes multiplexers 306, 308, and 310 that select taps (i.e., voltage slopes/profiles) of bandgap circuitry 302 for a neg2_pregain voltage 312, a neg1_pregain voltage 314, and a flat_pregain voltage 316 (e.g., 402, 404, and 406 in FIG. 4).

Power supply circuitry 102 further includes circuitry 320. Circuitry 320 includes amplifiers 322, 324, and 326 and trim circuitry 321 and 323 that amplify and trim neg1_pregain voltage 312, neg2_pregain voltage 314, and flat_pregain voltage 316 to provide neg2_gain 328, neg1_gain1 330, and vgg_flat_gain_slope1 332, respectively. Trim circuitry 321 and 323 may be useful to trim absolute values of Vgg 206-1 through 206-n in FIG. 2.

Circuitry 320 further includes compare and multiplex circuitry 324 that outputs the greater of net2_gain 328 and neg1_gain1 330 as a temperature dependent voltage 328. Using the examples of FIG. 4, compare and multiplex circuitry 324 may output a temperature dependent value of profile 402 when the temperature is below approximately 85 degrees, and may output a temperature dependent value of profile 404 when the temperature is above approximately 85 degrees.

Circuitry 320 further includes compare and multiplex circuitry 330 that outputs the lesser of voltage 328 and vgg_flat_gain_slope1 322 as a temperature dependent voltage 332. Using the examples of FIG. 4, compare and multiplex circuitry 330 may output the value of profile 406 when the temperature is above approximately 0 degrees, and may output temperature dependent voltage 328 when the temperature is below zero degrees.

Circuitry 320 further includes amplifier circuitry 334 that amplifies temperature dependent voltage 332 to provide temperature dependent voltage ref_vgg 108. Temperature dependent voltage ref_vgg 108 may be referred to as a bandgap reference voltage.

Circuitry 320 may further include a multiplexer 336 that outputs a selectable one of temperature dependent voltage 332 and a test value 338 to amplifier circuitry 328. Test value may be equal to VDD*K, where K=1, 0.99, 0.98, and 0.97.

Figure 5:
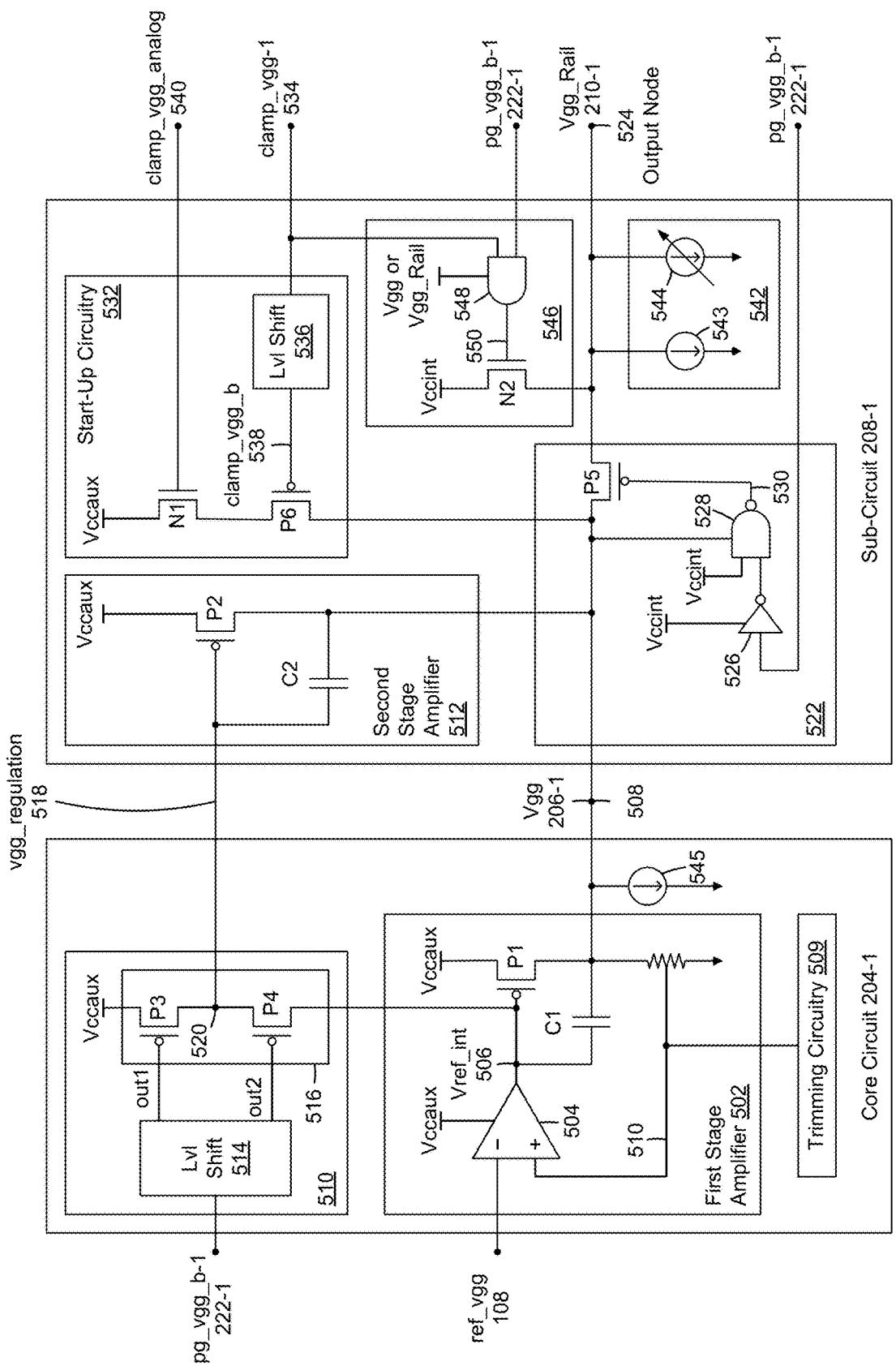
FIG. 5 is a schematic diagram of a core circuit and a sub-circuit of the voltage regulator circuitry, according to an embodiment.

FIG. 5 is a schematic diagram of core circuit 204-1 and sub-circuit 208-1 of voltage regulator circuitry 104-1, according to an embodiment. Sub-circuits 208-2 through 208-j may be similar to sub-circuit 208-1. Voltage regulator circuitry 104-2 through 104-n may be similar to voltage regulator circuitry 104-1. For ease of illustration, reference numbers are omitted for Vccaux 112 and Vccint 114.

Core circuit 204-1 and sub-circuit 208-1, are described below for an example in which Vccaux 112, ref_vgg 108, and Vgg_Rail 210-1 are approximately 1.5 volts, and Vccint 114 is approximately 0.85 volts. The example voltages are provided for illustrative purposes. Methods and systems disclosed herein are not limited to the example voltages.

Core circuit 204-1 includes a first stage amplifier circuit 502 that controls Vgg 206-1 based on ref_vgg 108. In the example of FIG. 5, first stage amplifier circuit 502 includes a differential amplifier circuit 504 that controls a voltage ref_int 506 based on a difference between reference voltage ref_vgg 108 and a feedback voltage 510. Feedback voltage 510 may be a fraction of Vgg 206-1. First stage amplifier circuit 502 further includes a power MOSFET P1 that couples Vccaux to a node 508 under control of an internal analog voltage ref_int 506. If Vgg 206-1 rises too high relative to reference voltage ref_vgg 108, differential amplifier circuit 504 reduces the drive to power MOSFET P1 (i.e., reduces ref_int 506) to maintain Vgg 206-1 at a constant level.

Core circuit 204-1 may further includes trimming circuitry 509 that essentially trims Vgg 206-1.

Sub-circuit 208-1 includes a second stage amplifier circuit 512 coupled to node 508. In the example of FIG. 5, second stage amplifier circuit 512 includes a power MOSFET P2 that couples Vccaux to node 508.

Core circuit 204-1 and/or sub-circuit 208-1 may include power gating circuitry to selectively disable one or more features/circuits of core circuit 204-1, sub-circuit 208-1, and/or loads 212 (FIG. 2). Power gating may be used, for example, to turn on/off individual rows of CRAM cells. Power gating may be useful to reduce power consumption (e.g., of Vccaux) and/or leakage current (e.g., of CRAM cells). Power gating may also be useful to increase yield by disabling a subset of loads (e.g., a row of CRAM cells) that contain a faulty device.

In FIG. 5, core circuit 204-1 receives a power gating control pg_vgg_b-1 222-1 to control power MOSFET P2 (i.e., to preclude current flow through power MOSFET P2). Core circuits 204-2 through 204-n may receive respective power gating controls pg_vgg_b-2 through pg_vgg_b-n.

In an embodiment, pg_vgg_b-1 222-1 has a relatively low voltage swing (e.g., 0 v to Vccint), whereas MOSFET P2 handles relatively high voltages of Vccaux and Vgg 206-1 (e.g., ~1.5 v). If pg_vgg_b-1 222-1 were applied directly to the gate of MOSFET P2, the lower end of the voltage swing may result in a gate-to-source voltage that stresses the gate oxide layer of MOSFET P2. In FIG. 5, core circuit 204-1 includes power gating control circuitry 510 that converts pg_vgg_b-1 222-1 to vgg_regulation 518 having a voltage swing of ref_int 506 to Vccaux.

Power gating control circuitry 510 includes a MOSFET P3 that provides the upper end of the voltage swing of vgg_regulation 518 (i.e., Vccaux) to a node 520. Power gating control circuitry 510 further includes a MOSFET P4 that provides the lower end of the voltage swing of vgg_regulation 518 (i.e., ref_int 506) to node 520. When power gating is disabled (i.e., operational mode), MOSFET P3 is off (non-conducting) and MOSFET P4 couples ref_int to node 520, which turns on P2. When power gating is enabled (i.e., power gate mode or power down mode), MOSFET P4 is off (non-conducting) and MOSFET P3 couples Vccaux to node 520, which turns P2 off.

MOSFETs P3 and P4 are controlled with out1 and out2, respectively. Voltage swings of out1 and out2 should not stress the gate oxide layers of MOSFETS P3 and P4. Power gating control circuitry 510 includes level shift circuitry 514 that sets the voltage swings of out1 and out 2. In an embodiment, level shift circuitry 514 provides out1 with a voltage swing of Vccaux to Vccaux/2 (e.g., 1.5 v to 0.75 v), and provides out2 with a voltage swing of 0 v to Vccaux (e.g., 0 v to 1.5 v), as illustrated in Table 1 below. Level shift circuitry 514 is described further below with reference to FIG. 6.

TABLE 1

| Mode | pg_vgg_b-1 | out1 | out2 | P3 | P4 | vgg_regulation 518 | P2 |
|---|---|---|---|---|---|---|---|
| Operational | 0 v | Vccaux (e.g., 1.5 v) | 0 v | Off | On | ref_int 506 (e.g., ~0.9 to 1.2 v) | On |
| Power Gate | Vccint (e.g., 0.85 v) | Vccaux/2 (e.g., 0.75 v) | Vccaux (e.g., 1.5 v) | On | Off | Vccaux (e.g., 1.5 v) | Off |

In FIG. 5, sub-circuit 208-1 includes additional power gating control circuitry 522 that is controlled by power gating control pg_vgg_b-1 222-1. Power gating control circuitry 522 includes a MOSFET P5 that couples node 508 to an output node 524 (i.e., to provide Vgg 206-1 to output node 524 as Vgg_Rail 210-1) in the operational mode, and de-couples node 508 from output node 524 in power gate/power down mode.

As described above with respect to power gating control circuitry 510, pg_vgg_b-1 222-1 may have a relatively low voltage swing (e.g., 0 v to Vccint), whereas MOSFET P5 handles relatively high voltages of Vgg 206-1 and Vgg_RAL 210-1 (e.g., ~1.5 v). If pg_vgg_b-1 222-1 were applied directly to the gate of MOSFET P5, the lower end of the voltage swing may result in a gate-to-source voltage that stresses a gate oxide layer of MOSFET P5. Power gating control circuitry 522 converts pg_vgg_b-1 222-1 to a control 530 having a voltage swing within the domain of Vgg 206-1. In the example of FIG. 5, control 530 has a voltage swing of 0 v to Vgg (e.g., 0 v to 1.5 volts).

In the example of FIG. 5, power gating control circuitry 522 includes inverter circuitry 526 (powered by Vccint) that inverts pg_vgg_b-1 222-1, and NAND circuitry 528 (powered by Vgg 206-1) that NANDs inverted pg_vgg_b-1 222-1 with Vccint to provide a control 530. In this example, when pg_vgg_b-1 222-1 is low (i.e., de-asserted), control 530 is low, which closes P6 to couple node 508 to output node 524. When pg_vgg_b-1 is high (i.e., asserted), control 530 is high, which opens P6 to de-couple node 508 from output node 524. The arrangement of circuitry and power sources within power gating control circuitry 522 ensures that gate-to-source voltages of devices within power gating control circuitry 522 are not stressed.

In FIG. 5, sub-circuit 208-1 further includes start-up circuitry 532 to directly apply Vccaux to output node 524 at start-up. Start-up circuitry 532 includes a power MOSFET P6 that couples Vccaux to output node 524 based on a control, clamp_vgg_1 534. In an embodiment, clamp_vgg_1 534 has a relatively low voltage swing (e.g., 0 v to Vccint), whereas MOSFET P6 handles relatively high voltages of Vccaux and Vgg 206-1 (e.g., ~1.5 v). If clamp_vgg_1 534 were applied directly to the gate of MOSFET P6, the lower end of the voltage swing may stress the gate oxide layer of MOSFET P6. In FIG. 5, start-up circuitry 532 includes level shift circuitry 536 that converts clamp_vgg-1 534 to a control clamp_vgg_b 538 that has a voltage swing of Vccaux to Vccaux/2 (e.g., 1.5 v to 0.75 v), as summarized in Table 2 below. Level shift circuitry 536 is described further below with reference to FIG. 7.

TABLE 2

| Mode | clamp_vgg-1 534 | clamp_vgg_b 538 | P6 |
|---|---|---|---|
| Operational | 0 v | Vccaux (e.g., 1.5 v) | On |
| Power Gate | Vccint (e.g., 0.85 v) | Vccaux/2 (e.g., 0.75 v) | Off |

Start-up circuitry 532 may further include a MOSFET N1 that couples Vccaux to MOSFET P5 based on a control, clamp_vgg_analog 540. In an embodiment, MOSFET is maintained in a conductive state in both the operational mode and the power gate mode.

Sub-circuit 208-1 may further include clamp circuitry 546 that clamps node 210-1 (i.e., Vgg_Rail 210-1) to Vccint (e.g., 0.85 v) when entering power gate mode. Clamp circuitry 546 may be useful to accommodate relative large inherent capacitances of loads 212 (i.e., for stability). In FIG. 5, clamp circuitry 546 includes AND circuitry 548 that controls a MOSFET N2 to clamp node 210-1 to Vccint when pg_vgg_b-1 222-1 and clamp_vgg-1 534 are activated. In the example of FIG. 5, AND circuitry 548 provides a control 550 that has a voltage swing of 0 v to Vgg 206-1 (e.g., 0 v to 1.5 v) or a voltage swing of 0 v to Vgg_Rail 210-1.

In the example of FIG. 5, sub-circuit 208-1 further includes leaker circuitry 542 to draw leakage current from output node 524. Leaker circuitry 542 may provide stability to a negative feedback loop (i.e., feedback voltage 510) of first stage amplifier 502. Leaker circuitry 540 includes fixed leaker circuitry 543 and variable or programmable leaker circuitry 544. In an embodiment, programmable leaker circuitry 544 is programmable in increments of 8×, 4×, 2×, 1×, and 0.5×. In an embodiment, fixed leaker circuitry 543 is omitted, and fixed leaker circuitry 545 is provided in core circuit 204-1. Providing fixed leaker circuitry 545 in core circuit 204-1 in place of fixed leaker circuitry 543 in each sub-circuit 208 may reduce area and power consumption.

Figure 6:
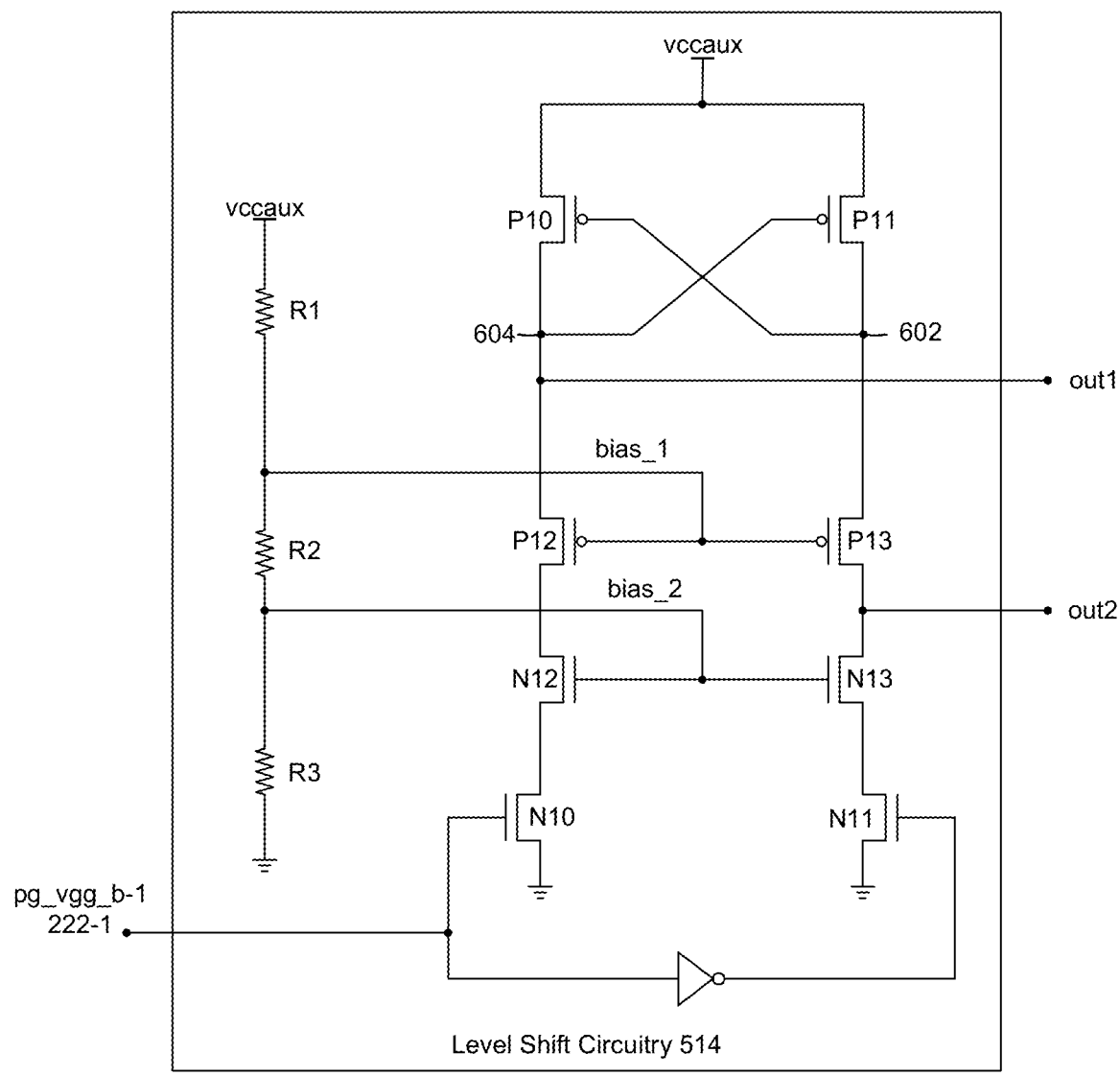
FIG. 6 is a schematic of level shift circuitry that converts a voltage swing of a power gate control to desired voltage swings of first and second power gate controls, according to an embodiment.

FIG. 6 is a schematic of level shift circuitry 514 that converts the voltage swing of power gate control pg_vgg_b-1 to the desired voltage swings of out1 and out2, such as illustrated in Table 1, according to an embodiment. In the example of FIG. 6, level shift circuitry 514 is configured as a differential voltage divider circuit that includes a first set of series-coupled MOSFETs, P10, P12, N12, and N10, and a second set of series-coupled MOSFETs, P11, P13, N13, and N11.

Level shift circuitry 514 further includes a non-differential voltage divider circuit, illustrated here as series-coupled resistors R1, R2, and R3, to bias P12 and P13 with a bias_1 control, and to bias N12 and N13 with a bias_2 control. Resistors R1, R2, and R3 are selected such that P12, P13, N12, and N13 serve as voltage-controller resistors to provide out1 and out2 with desired voltage swings.

Power gate control pg_vgg_b-1 222-1, and its compliment, are applied to gates of MOSFETs N10 and N11, respectively. When power gate control pg_vgg_b-1 222-1 is low (e.g., 0 v), N10 is off (non-conducting) and N11 is on.

When N11 is on, N13 is on and P13 is at least partially on. In this situation, out2 is pulled-down to 0 v through N13 and N11. Also, a node 602 is pulled-down through P13, N13, and N11, which turns P10 on, which couples a node 604 (i.e., out1) to Vccaux (e.g., 1.5 v).

When power gate control pg_vgg_b-1 222-1 is high, or Vccint (e.g., 0.85 v), N10 is on and N11 is off. When N10 is on, N12 and P12 operate as voltage-controlled resistors, and node 604 is pulled-down to Vccaux/2 through P12, N12, and N10. Also, Vccaux/2 at node 604 turns P11 on, which turns P13 on, and out2 is coupled to Vccaux through P11 and P13. Thus, when power gate control pg_vgg_b-1 222-1 is low (e.g., 0 v), out1=Vccaux (e.g., 1.5 v) and out2=0 v. When power gate control pg_vgg_b-1 222-1 is high, or Vccint (e.g., 0.85 v), out1=Vccaux/2 (e.g., 0.75 v) and out2=Vccaux (e.g., 1.5 v).

Figure 7:
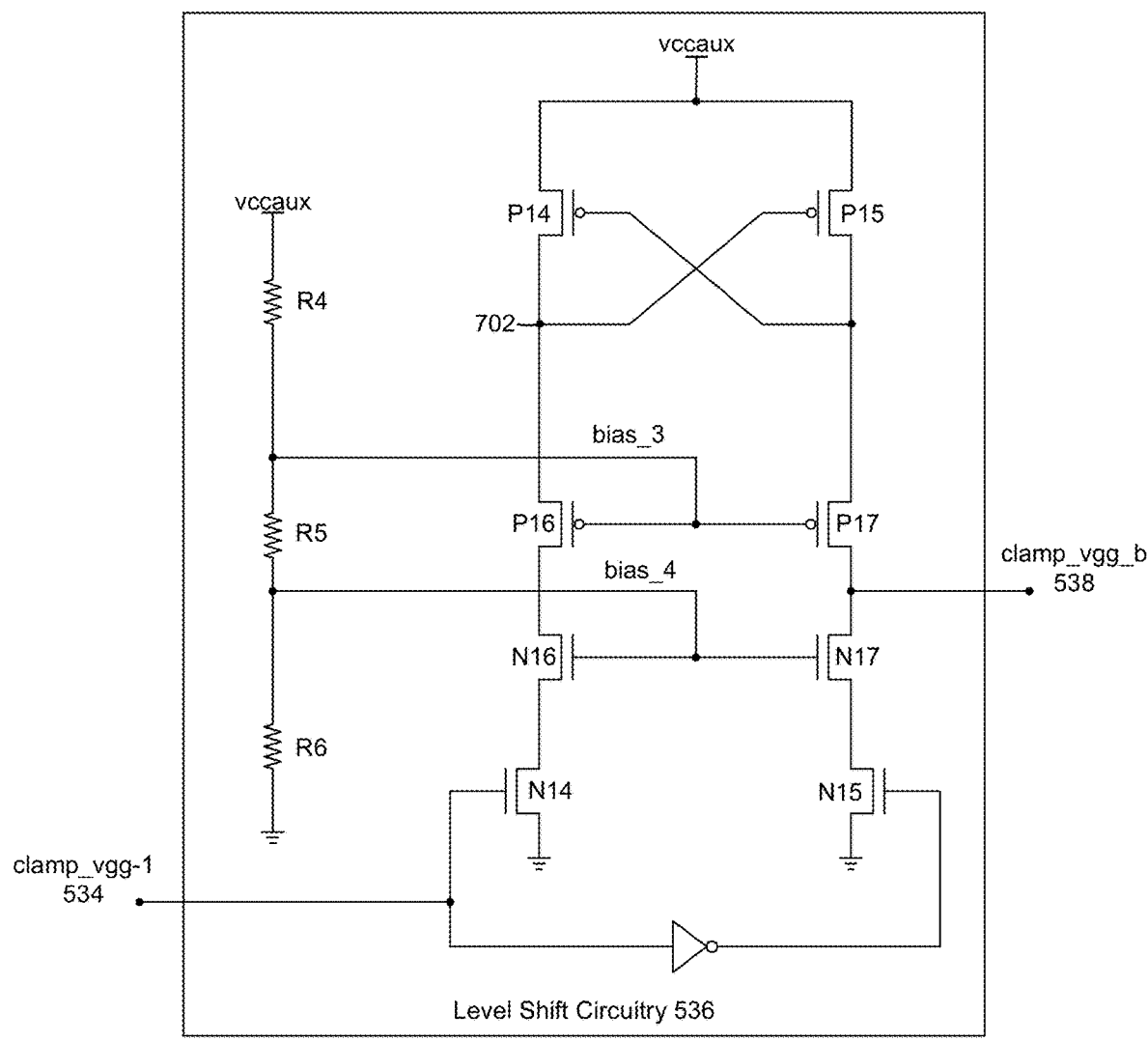
FIG. 7 is a schematic of level shift circuitry that converts a voltage swing of a clamp control to a desired voltage swing, according to an embodiment.

FIG. 7 is a schematic of level shift circuitry 536 that converts the voltage swing of clamp_vgg-1 534 to the desired voltage swing of clamp_vgg_b 538, such as illustrated in Table 2, according to an embodiment. In the example of FIG. 7, level shift circuitry 536 is configured as a differential voltage divider circuit that includes a first set of series-coupled MOSFETs, P14, P16, N16, and N14, and a second set of series-coupled MOSFETs, P15, P17, N17, and N15.

Level shift circuitry 536 further includes a non-differential voltage divider circuit, illustrated here as series-coupled resistors R4, R5, and R6, to bias P16 and P17 with a bias_3 control, and to bias N16 and N17 with a bias_4 control. Resistors R4, R5, and R6 are selected such that P16, P17, N16, and N17 serve as voltage-controller resistors to provide clamp_vgg_b 538 with a desired voltage swing.

Clamp_vgg-1 534 and its compliment are applied to gates of MOSFETs N14 and N15, respectively. When clamp_vgg-1 534 is low (e.g., 0 v), N14 is off (non-conducting) and N15 is on. When N15 is on, N17 turns on and clamp_vgg_b 538 is pulled-down to 0 v through N17 and N15. When clamp_vgg-1 534 is high or Vccint (e.g., 0.85 v), N14 is on and N15 is off. When N14 is on, N16 and P16 are at least partially on and a node 702 is pulled-down through P16, N16, and N14. When node 702 is pulled-down, P15 turns on, which turns on P17, and clamp_vgg_b 538 is pulled-up to Vccaux through P15 and P17. Thus, when clamp_vgg-1 534 is low (e.g., 0 v), clamp_vgg_b 538=Vccaux (e.g., 1.5 v). When clamp_vgg-1 534 is high, or Vccint (e.g., 0.85 v), clamp_vgg_b 538=Vccaux/2 (e.g., 0.75 v).

Voltage level shifters, as described herein, may be placed as needed to avoid over-voltage violations across any two terminals of thin-ox transistors. Proper biasing of thin-ox devices in combination of thin-ox level shifters provide design reliable and robust circuitry.

Dual clamps for ungated and gated Vgg rails from two different supplies (i.e., high voltage Vccaux and low voltage Vccint), as disclosed herein, may provide relatively fast settling of gated and ungated regulated supply voltages. These clamps simultaneously prevent overvoltage conditions across terminals of the thin-ox transistors.

As disclosed herein, bias conditions and digital controls are configured to avoid over-voltage violations (e.g., gate-to-source voltage stress) in operational mode and power gating mode. This provides reliability/robustness and avoids chip burn out.

Figure 8:
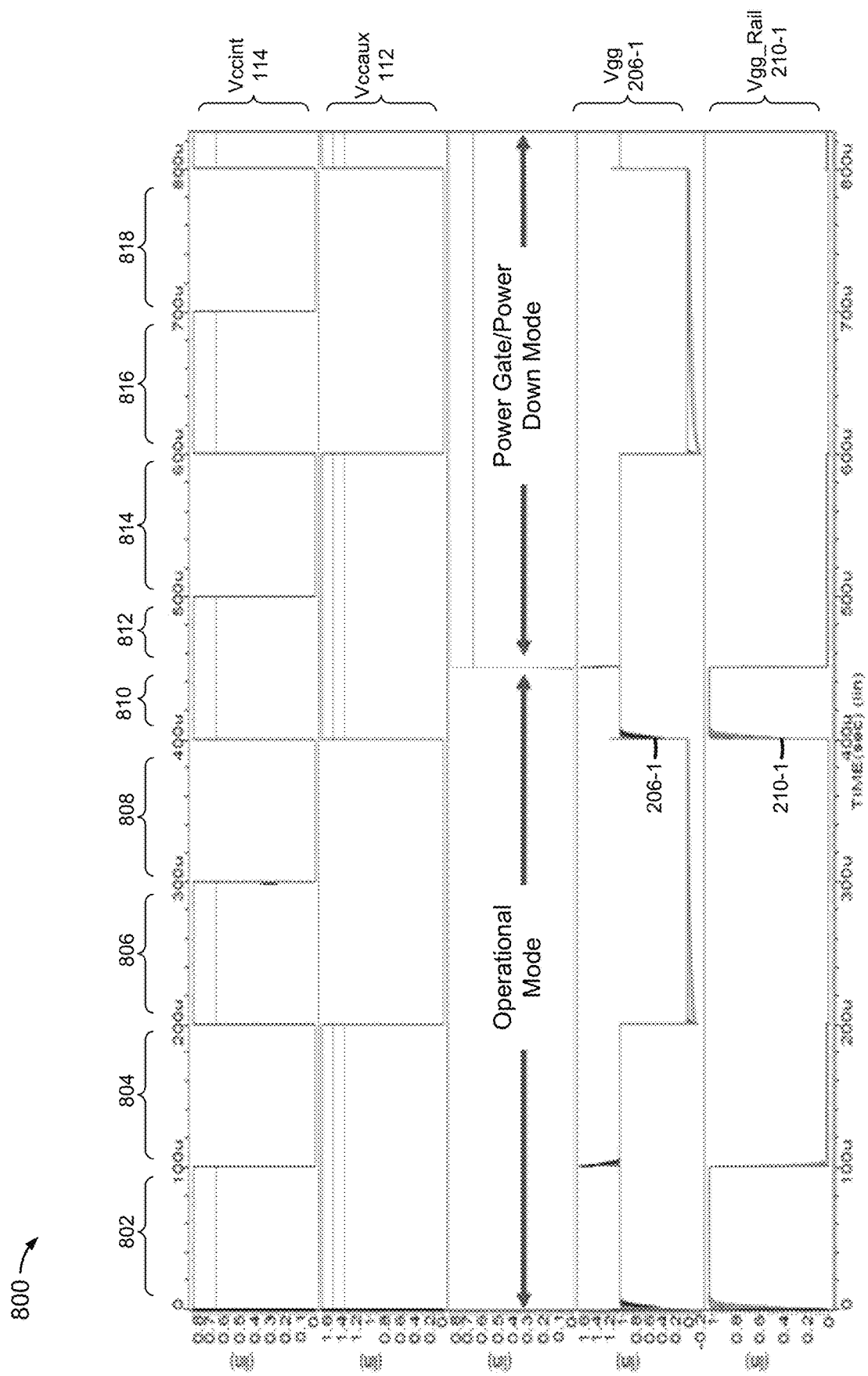
FIG. 8 is a simulation timing diagram of voltages illustrated in FIGS. 1-7, according to an embodiment.

FIG. 8 is a simulation timing diagram 800 of Vccint 114, Vccaux 112, Vgg 206-1, and Vgg_Rail 210-1, in operational mode (i.e., when P2 and P5 in FIG. 5 are on) and in power gate/power down mode (i.e., when P2 and P5 in FIG. 5 are off), according to an embodiment. In FIG. 8, 802 through 810 correspond to operational mode and 812 through 818 correspond to power gate/power down mode.

At 802, Vccint 114 and Vccaux 112 are on (e.g., ~0.85 v and 1.5 v, respectively). Here, Vgg 206-1 and Vgg_Rail 210-1 are high (e.g., ~1 v).

At 804, Vccint 114 is off and Vccaux 112 is on. Here, Vgg 206-1 is high and Vgg_Rail 210-1 is low.

At 806, Vccint 114 is on and Vccaux 112 is off. Here, Vgg 206-1 and Vgg_Rail 210-1 are low.

At 808, Vccint 114 and Vccaux 112 are off. Here, Vgg 206-1 and Vgg_Rail 210-1 are low.

At 810, Vccint 114 and Vccaux 112 are on, as at 802. Here, Vgg 206-1 and Vgg_Rail 210-1 are high (e.g., ~1 v), as at 802.

At 812 (power gate mode), Vccint 114 and Vccaux 112 are on. Here, Vgg 206-1 is high and Vgg_Rail 210-1 is low.

At 814, Vccint 114 is off and Vccaux 112 is on. Here, Vgg 206-1 remains high and Vgg_Rail 210-1 is low.

At 816, Vccint 114 is on and Vccaux 112 is off. Here, Vgg 206-1 and Vgg_Rail 210-1 are low.

At 818, Vccint 114 and Vccaux 112 are off. Here, Vgg 206-1 and Vgg_Rail 210-1 are low.

Figure 9A:
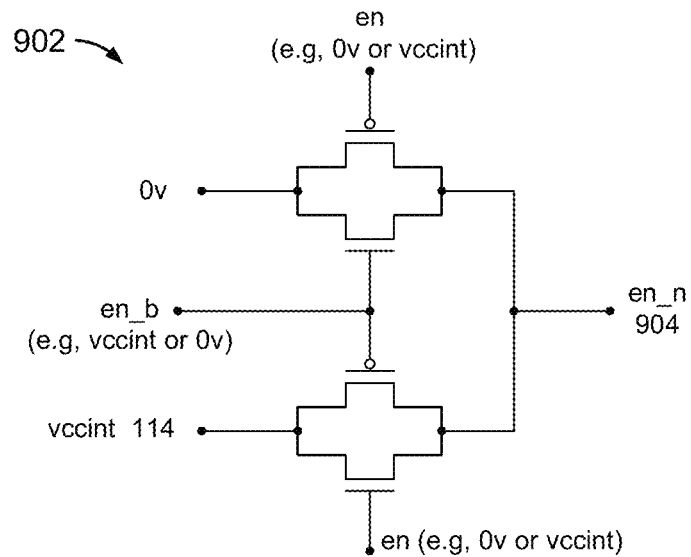
FIG. 9A is a schematic diagram of thin-ox circuitry that generates a control to control pull-down devices (e.g., N-type devices) in operational amplifiers, according to an embodiment.

FIG. 9A is a schematic diagram of thin-ox circuitry 902 that generates a control en_n 904 to control pull-down devices (e.g., N-type devices) in operational amplifiers (e.g., amplifier 504 in FIG. 5), according to an embodiment.

Figure 9B:
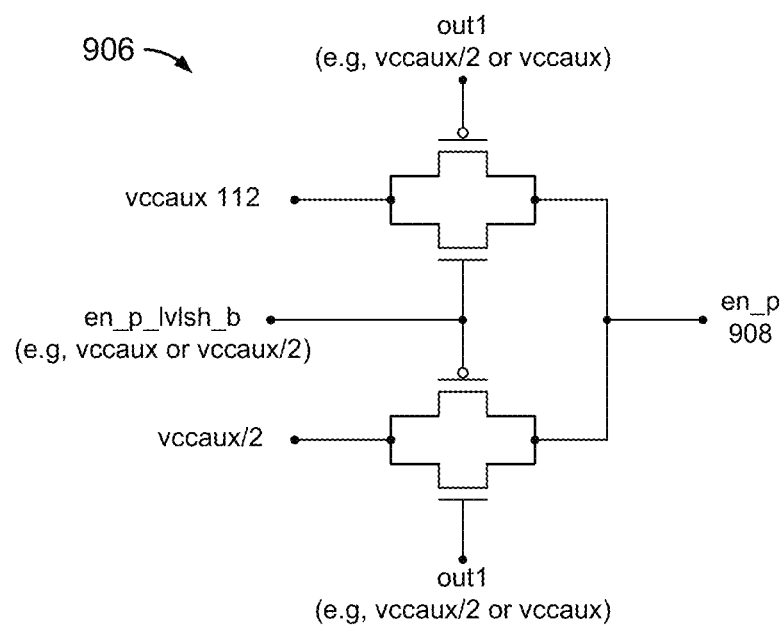
FIG. 9B is a schematic diagram of thin-ox circuitry that generates a control to control pull-up devices (e.g., P-type devices) in operational amplifiers, according to an embodiment.

FIG. 9B is a schematic diagram of thin-ox circuitry 906 that generates a control en_p 908 to control pull-up devices (e.g., P-type devices) in operational amplifiers (e.g., amplifier 504 in FIG. 5), according to an embodiment.

Figure 10:
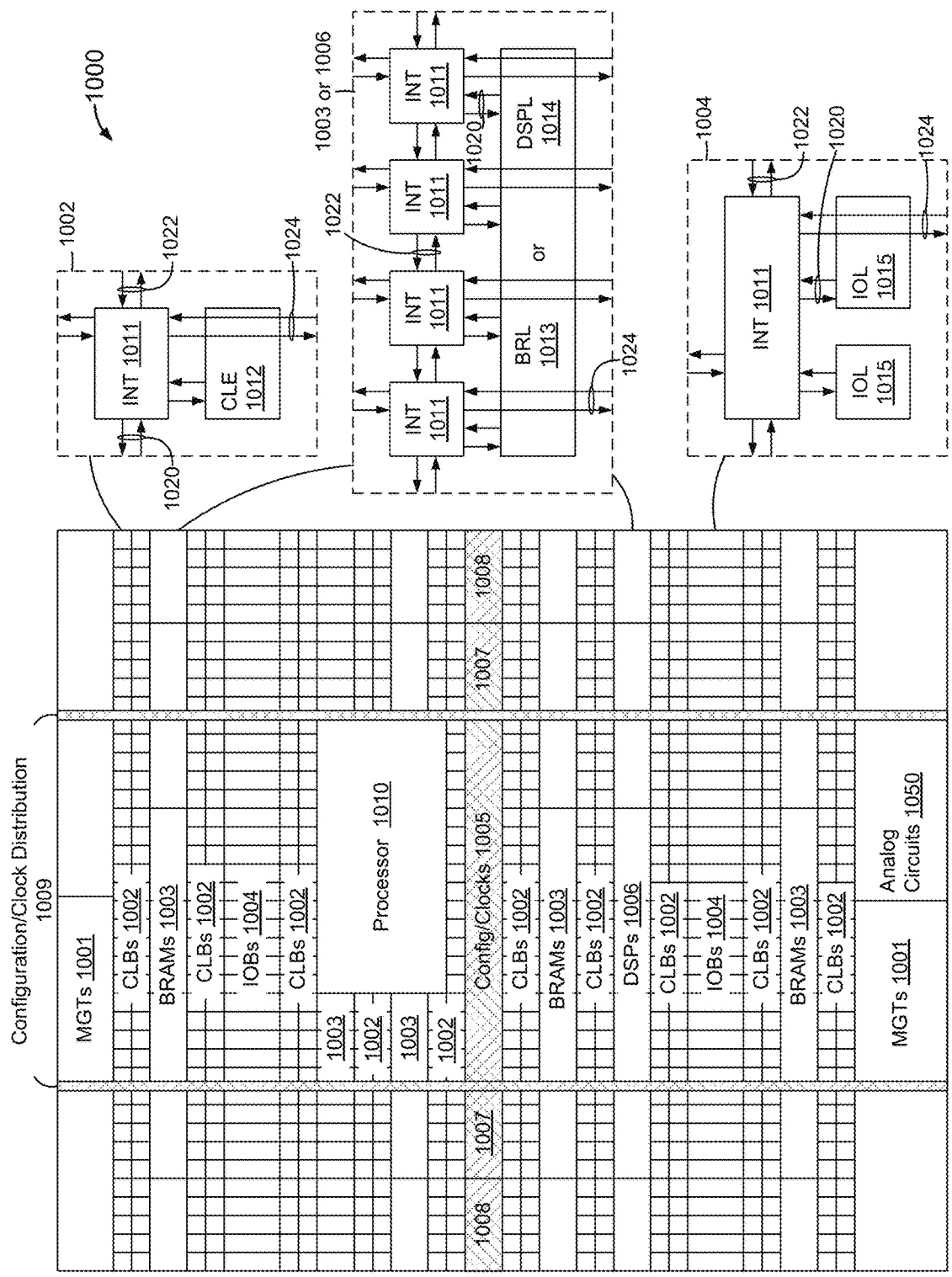
FIG. 10 is a block diagram of configurable circuitry that includes an array of configurable or programmable circuit blocks or tiles, according to an embodiment.

System 100 and/or system 200 may include one or more of a variety of types of configurable circuit blocks, such as described below with reference to FIG. 10. FIG. 10 is a block diagram of configurable circuitry 1000, including an array of configurable or programmable circuit blocks or tiles, according to an embodiment. The example of FIG. 10 may represent a field programmable gate array (FPGA) and/or other IC device(s) that utilizes configurable interconnect structures for selectively coupling circuitry/logic elements, such as complex programmable logic devices (CPLDs).

In the example of FIG. 10, the tiles include multi-gigabit transceivers (MGTs) 1001, configurable logic blocks (CLBs) 1002, block random access memory (BRAM) 1003, input/output blocks (IOBs) 1004, configuration and clocking logic (Config/Clocks) 1005, digital signal processing (DSP) blocks 1006, specialized input/output blocks (I/O) 1007 (e.g., configuration ports and clock ports), and other programmable logic 1008, which may include, without limitation, digital clock managers, analog-to-digital converters, and/or system monitoring logic. The tiles further includes a dedicated processor 1010.

One or more tiles may include a programmable interconnect element (INT) 1011 having connections to input and output terminals 1020 of a programmable logic element within the same tile and/or to one or more other tiles. A programmable INT 1011 may include connections to interconnect segments 1022 of another programmable INT 1011 in the same tile and/or another tile(s). A programmable INT 1011 may include connections to interconnect segments 1024 of general routing resources between logic blocks (not shown). The general routing resources may include routing channels between logic blocks (not shown) including tracks of interconnect segments (e.g., interconnect segments 1024) and switch blocks (not shown) for connecting interconnect segments. Interconnect segments of general routing resources (e.g., interconnect segments 1024) may span one or more logic blocks. Programmable INTs 1011, in combination with general routing resources, may represent a programmable interconnect structure.

A CLB 1002 may include a configurable logic element (CLE) 1012 that can be programmed to implement user logic. A CLB 1002 may also include a programmable INT 1011.

A BRAM 1003 may include a BRAM logic element (BRL) 1013 and one or more programmable INTs 1011. A number of interconnect elements included in a tile may depends on a height of the tile. A BRAM 1003 may, for example, have a height of five CLBs 1002. Other numbers (e.g., four) may also be used.

A DSP block 1006 may include a DSP logic element (DSPL) 1014 in addition to one or more programmable INTs 1011. An IOB 1004 may include, for example, two instances of an input/output logic element (IOL) 1015 in addition to one or more instances of a programmable INT 1011. An I/O pad connected to, for example, an I/O logic element 1015, is not necessarily confined to an area of the I/O logic element 1015.

In the example of FIG. 10, config/clocks 1005 may be used for configuration, dock, and/or other control logic. Vertical columns 1009 may be used to distribute clocks and/or configuration signals.

A logic block (e.g., programmable of fixed-function) may disrupt a columnar structure of configurable circuitry 1000. For example, processor 1010 spans several columns of CLBs 1002 and BRAMs 1003. Processor 1010 may include one or more of a variety of components such as, without limitation, a single microprocessor to a complete programmable processing system of microprocessor(s), memory controllers, and/or peripherals.

In FIG. 10, configurable circuitry 1000 further includes analog circuits 1050, which may include, without limitation, one or more analog switches 107, multiplexers, and/or de-multiplexers. Analog switches 107 may be useful to reduce leakage current.

FIG. 10 is provided for illustrative purposes. Configurable circuitry 1000 is not limited to numbers of logic blocks in a row, relative widths of the rows, numbers and orderings of rows, types of logic blocks included in the rows, relative sizes of the logic blocks, illustrated interconnect/logic implementations, or other example features of FIG. 10.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the users computer and partly on a remote computer or entirely on the remote computer or server. In the latter scenario, the remote computer may be connected to the users computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An apparatus, comprising:
   low drop out (LDO) regulator circuitry configured to regulate an output voltage based on a reference voltage;
   wherein the LDO regulator circuitry comprises metal-oxide-semiconductor field-effect transistors (MOSFETs);
   wherein gate-oxide layers of the MOSFETs are 3 nanometers or less;
   wherein a voltage of a supply rail of the LDO regulator circuitry, the reference voltage, and the output voltage exceed a desired gate-to-source voltage of the MOSFETs; and
   wherein the LDO regulator circuitry is configured to maintain gate-to-source voltages of the MOSFETs within the desired gate-to-source voltage.

2. The apparatus of claim 1, wherein the LDO regulator circuitry is configured to maintain the gate-to-source voltages of the MOSFETs within the desired gate-to-source voltage to protect the gate-oxide layers of the MOSFETs from strain.

3. The apparatus of claim 1, wherein:
   the LDO regulator circuitry comprises a plurality of LDO regulator circuits configured to regulate output voltages for respective load circuitry based on the reference voltage; and
   a first one of the LDO regulator circuits comprises a core circuit configured to regulate a voltage at an output of the core circuit based on the reference voltage, and a plurality of sub-circuits configured to distribute the regulated voltage of the core circuit to respective loads.

4. The apparatus of claim 3, wherein:
   the core circuit comprises a first stage amplifier circuit comprising a differential amplifier and a first MOSFET configured to couple the supply rail to the output of the core circuit based on an output of the differential amplifier;
   a first sub-circuit of the sub-circuits comprises a regulated rail coupled to the output of the core circuit, and a second stage amplifier circuit comprising a second MOSFET configured to provide power from the supply rail to the regulated rail; and
   the core circuit further comprises first power gate circuitry configured to control the second MOSFET based on a power gate control, including to shift a voltage swing of the power gate control to maintain a gate-to-source voltage of the second MOSFET within the desired gate-to-source voltage.

5. The apparatus of claim 4, wherein:
   the first power gate circuitry is configured to shift the voltage swing of the power gate control from a voltage swing of V1 to V2, to a voltage swing of V3 to V4;

$$V1 = 0 \text{ v};$$
$$0.7 \le V2 < 0.9 \text{ v};$$
$$0.9 \text{ v} \le V3 < 1.2 \text{ v; and}$$
$$V4 \ge 1.2 \text{ v}.$$

6. The apparatus of claim 4, wherein the first power gate circuitry comprises:
   a third MOSFET configured to couple the supply rail to a gate of the second MOSFET;
   a fourth MOSFET configured to couple the output of the differential amplifier to the gate of the second MOSFET; and
   level shift circuitry configured to control the third and fourth MOSFETS based on the power gate control.

7. The apparatus of claim 6, wherein the level shift circuitry comprises a differential MOSFET-based voltage divider circuit comprising a first output configured to control the third MOSFET and a second output configured to control the fourth MOSFET.

8. The apparatus of claim 7, wherein:
   the power gate control has a voltage swing of V1 to V2;
   the differential MOSFET-based voltage divider circuit is configured to provide the first output with a voltage swing of V3 to V4, and to provide the second output with a voltage swing of V5 to V6;

$V1 = 0$ v;

$0.7 \leq V2 < 0.9$ v;

$V3 \geq 1.2$ v;

$V4 = \frac{1}{2} V3$;

$V5 = 0$ v; and $V6 \geq 1.2$ v.

9. The apparatus of claim 4, wherein the first sub-circuit further comprises second power gate circuitry, and wherein the second power gate circuitry comprises:
 a third MOSFET configured to couple the regulated rail to an output of the first sub-circuit based on the power gate control; and
 level shift circuitry configured to control the third MOSFET based on the power gate control, including to shift the voltage swing of the power gate control to a voltage domain of the third MOSFET.

10. The apparatus of claim 4, wherein the first sub-circuit further comprises start-up circuitry, and wherein the start-up circuitry comprises:
 a third MOSFET configured to apply the supply rail to an output of the first sub-circuit; and
 level shift circuitry configured to control the third MOSFET based on a clamp control, including to shift a voltage swing of the clamp control to maintain a gate-to-source voltage of the third MOSFET within the desired gate-to-source voltage.

11. The apparatus of claim 10, wherein the level shift circuitry comprises a differential MOSFET-based voltage divider circuit.

12. The apparatus of claim 11, wherein:
 the differential MOSFET-based voltage divider circuit is configured to shift the voltage swing of the clamp control from a voltage swing of V1 to V2, to a voltage swing of V3 to V4;

$V1 = 0$ v;

$0.7 \leq V2 < 0.9$ v;

$V3 \geq 1.2$ v; and $V4 = \frac{1}{2} V3$.

13. The apparatus of claim 4, wherein the first sub-circuit further comprises clamp circuitry, and wherein the clamp circuitry comprises:
 a third MOSFET configured to clamp an output of the first sub-circuit to a voltage that is below the voltage of the supply rail; and
 control circuitry configured to control the third MOSFET with a control having a voltage swing of 0 v to voltage of the regulated rail, based on the power gate control and a clamp control.

14. The apparatus of claim 4, wherein:
 the core circuit further comprises fixed leaker circuitry coupled to the output of the core circuit; and
 the first sub-circuit comprises programmable leaker circuitry coupled to an output of the sub-circuit.

15. The apparatus of claim 4, wherein the LDO regulator circuitry further comprises:
 a first stage amplifier circuit comprising a differential amplifier and a first MOSFET configured to couple the supply rail to a regulated rail based on an output of the differential amplifier;
 a second stage amplifier circuit comprising a second MOSFET configured to provide power from the supply rail to the regulated rail; and
 first power gate circuitry configured to control the second MOSFET based on a power gate control, including to shift a voltage swing of the power gate control to maintain a gate-to-source voltage of the second MOSFET within the desired gate-to-source voltage.

16. The apparatus of claim 15, wherein the LDO regulator circuitry further comprises second power gate circuitry, and wherein the second power gate circuitry comprises:
 a third MOSFET configured to couple the regulated rail to an output of the first sub-circuit based on the power gate control; and
 level shift circuitry configured to control the third MOSFET based on the power gate control, including to shift the voltage swing of the power gate control to a voltage domain of the third MOSFET.

17. The apparatus of claim 15, wherein the LDO regulator circuitry further comprises start-up circuitry, and wherein the start-up circuitry comprises:
 a third MOSFET configured to apply the supply rail to an output of the first sub-circuit; and
 level shift circuitry configured to control the third MOSFET based on a clamp control, including to shift a voltage swing of the clamp control to maintain a gate-to-source voltage of the third MOSFET within the desired gate-to-source voltage.

18. The apparatus of claim 15, wherein the LDO regulator circuitry further comprises clamp circuitry, and wherein the clamp circuitry comprises:
 a third MOSFET configured to clamp an output of the first sub-circuit to a voltage that is below the voltage of the supply rail; and
 control circuitry configured to control the third MOSFET with a control having a voltage swing of 0 v to a voltage of the regulated rail, based on the power gate control and a clamp control.

19. A integrated circuit (IC) device, comprising:
 a gate-all-around metal-oxide-semiconductor field-effect transistor (MOSFET), configured to couple a first node of the IC device to a second node of the IC device; and
 power gate circuitry configured to control the MOSFET based on a power gate control, wherein a voltage swing of the power gate control exceeds a desired gate-to-source voltage of the MOSFET, and wherein the power gate circuitry is further configured to shift the voltage swing of the power gate control to maintain the gate-to-source voltage of the MOSFET within the desired gate-to-source voltage.

20. The IC device of claim 19, wherein a gate-oxide layer of the MOSFET is 3 nanometers or less.

* * * * *